(12) United States Patent
Lin

(10) Patent No.: US 8,158,510 B2
(45) Date of Patent: Apr. 17, 2012

(54) SEMICONDUCTOR DEVICE AND METHOD OF FORMING IPD ON MOLDED SUBSTRATE

(75) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 50 days.

(21) Appl. No.: 12/621,738

(22) Filed: Nov. 19, 2009

(65) Prior Publication Data

US 2011/0115050 A1    May 19, 2011

(51) Int. Cl.
*H01L 21/44* (2006.01)
(52) U.S. Cl. ........ 438/652; 438/112; 438/618; 438/669; 438/675; 257/E21.045
(58) Field of Classification Search .............. 438/112, 438/618, 652, 669, 675
See application file for complete search history.

(56) References Cited

U.S. PATENT DOCUMENTS

| | | | |
|---|---|---|---|
| 2007/0010064 A1* | 1/2007 | Das et al. ....................... 438/393 |
| 2007/0025092 A1* | 2/2007 | Lee et al. ....................... 361/761 |
| 2009/0072388 A1 | 3/2009 | Tews et al. |
| 2009/0072411 A1 | 3/2009 | Tews et al. |
| 2009/0315142 A1* | 12/2009 | Burke et al. ................... 257/528 |

* cited by examiner

*Primary Examiner* — Wai Sing Louie
(74) *Attorney, Agent, or Firm* — Robert D. Atkins; Patent Law Group: Atkins & Associates, P.C.

(57) ABSTRACT

A semiconductor device is made by depositing an encapsulant material between first and second plates of a chase mold to form a molded substrate. A first conductive layer is formed over the molded substrate. A resistive layer is formed over the first conductive layer. A first insulating layer is formed over the resistive layer. A second insulating layer is formed over the first insulating layer, resistive layer, first conductive layer, and molded substrate. A second conductive layer is formed over the first insulating layer, resistive layer, and first conductive layer. A third insulating layer is formed over the second insulating layer and second conductive layer. A bump is formed over the second conductive layer. The first conductive layer, resistive layer, first insulating layer, and second conductive layer constitute a MIM capacitor. The second conductive layer is wound to exhibit inductive properties.

28 Claims, 9 Drawing Sheets

SEMICONDUCTOR DEVICE AND METHOD OF FORMING IPD ON MOLDED SUBSTRATE

FIELD OF THE INVENTION

The present invention relates in general to semiconductor devices and, more particularly, to a semiconductor device and method of forming an integrated passive device (IPD) over an epoxy molding compound (EMC) substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In high frequency applications, such as radio frequency (RF) wireless communications, IPDs are often contained within the semiconductor device. Examples of IPDs include resistors, capacitors, and inductors. A typical RF system requires multiple IPDs in one or more semiconductor packages to perform the necessary electrical functions. The IPD is formed over a sacrificial substrate for structural support. The sacrificial substrate is removed by a grinding or etching process after formation of the IPD. The use of the sacrificial substrate adds processing steps and cost to the manufacturing process.

SUMMARY OF THE INVENTION

A need exists to simplify the manufacturing process and reduce cost in forming IPDs. Accordingly, in one embodiment, the present invention is a method of making a semiconductor device comprising the steps of forming a molded substrate, forming a first conductive layer over the molded substrate, removing a portion of the first conductive layer, forming a resistive layer over the first conductive layer, forming a first insulating layer over the resistive layer, forming a second insulating layer over the first insulating layer, resistive layer, first conductive layer, and molded substrate, removing a portion of the second insulating layer to expose the first insulating layer, resistive layer, and first conductive layer, forming a second conductive layer over the first insulating layer, resistive layer, and first conductive layer, forming a third insulating layer over the second insulating layer and second conductive layer, removing a portion of the third insulating layer to expose the second conductive layer, and forming a bump over the second conductive layer In another embodiment, the present invention is a method of making a semiconductor device comprising the steps of forming a molded substrate, forming a first conductive layer over the molded substrate, forming a first insulating layer over the first conductive layer, forming a second insulating layer over the first insulating layer, first conductive layer, and molded substrate, forming a second conductive layer over the first insulating layer and first conductive layer, forming a third insulating layer over the second insulating layer and second conductive layer, and forming an interconnect over the second conductive layer.

In another embodiment, the present invention is a method of making a semiconductor device comprising the steps of forming a molded substrate, forming an IPD over the molded substrate, and forming an interconnect over the IPD.

In another embodiment, the present invention is a semiconductor device comprising a molded substrate and first conductive layer formed over the molded substrate. A first insulating layer is formed over the first conductive layer. A second insulating layer is formed over the first insulating layer, first conductive layer, and molded substrate. A second conductive layer is formed over the second insulating layer and first conductive layer. A third insulating layer is formed over the second insulating layer and second conductive layer. An interconnect is formed over the second conductive layer

DETAILED DESCRIPTION OF THE DRAWINGS

Figure 1:
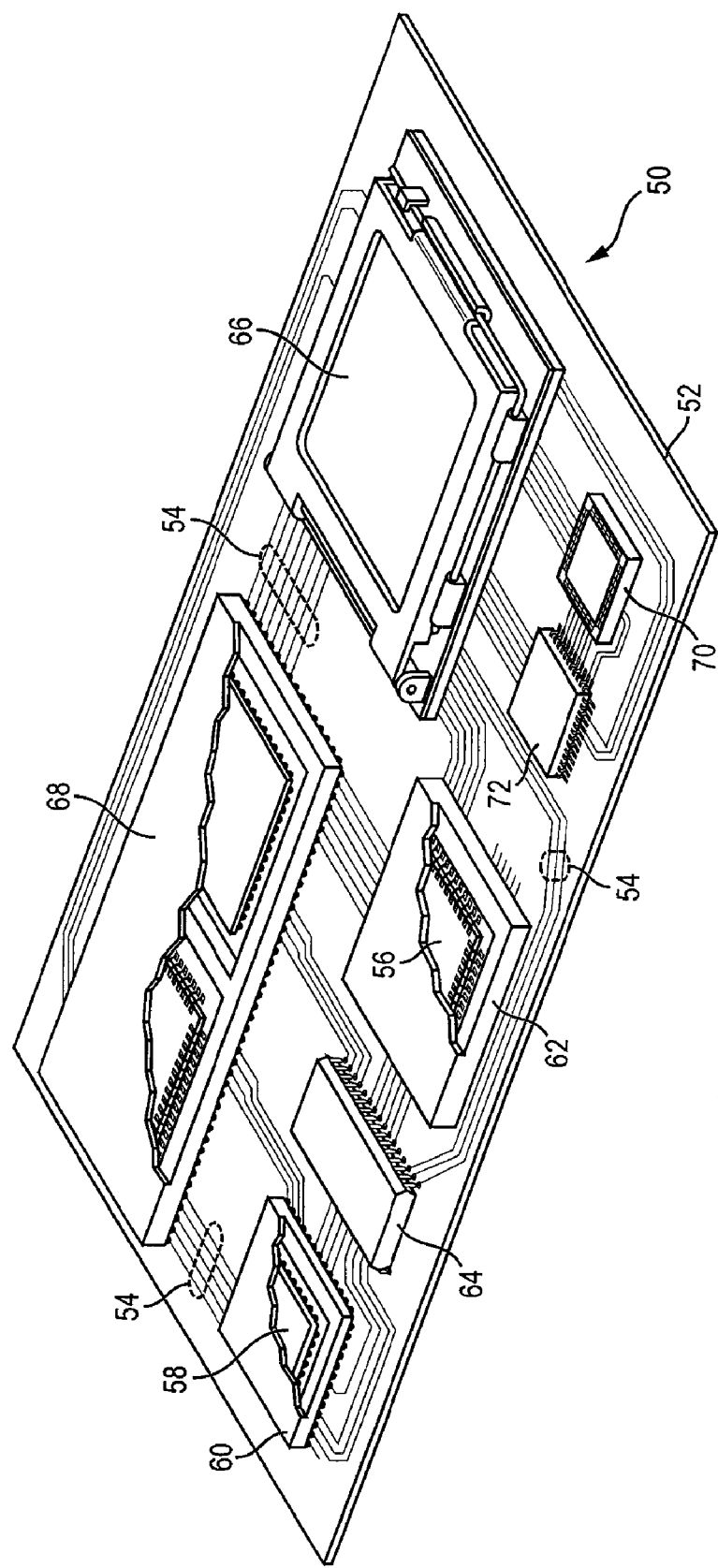
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
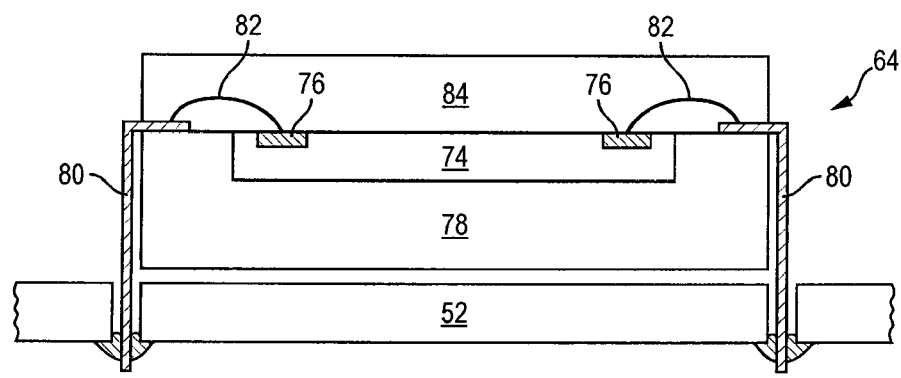
FIGS. 2a-2c illustrate further detail of the representative semiconductor packages mounted to the PCB.
Figure 2B:
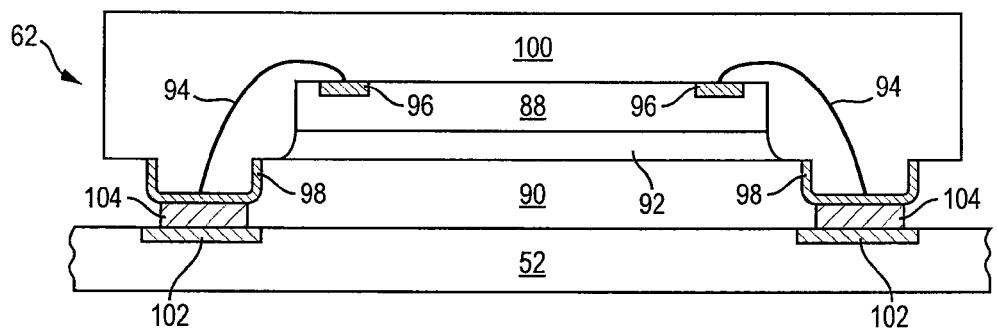
Figure 2C:
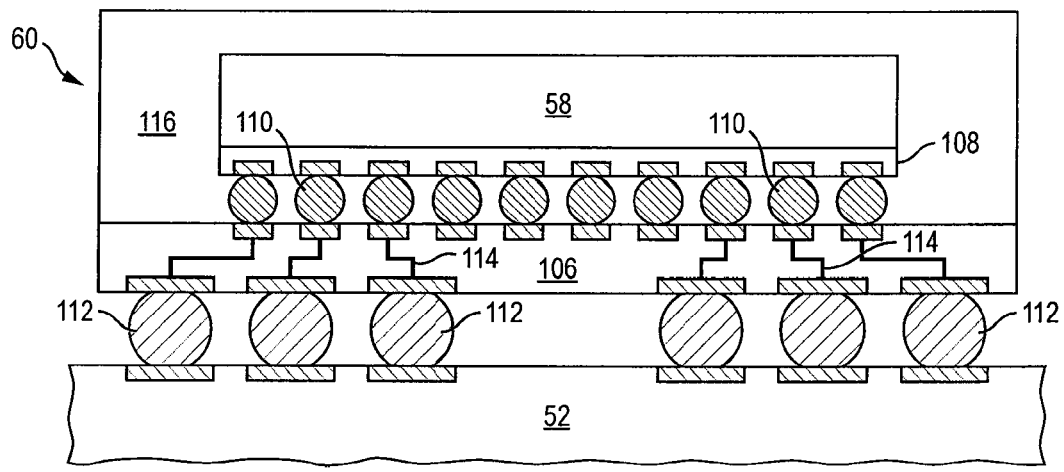

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
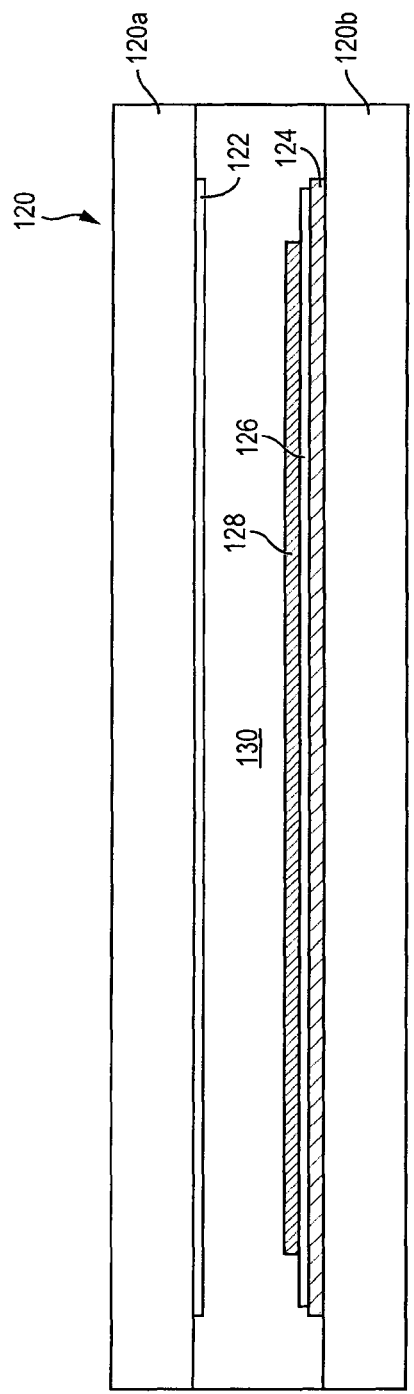
FIGS. 3a-3i illustrate a process of forming an IPD over an EMC substrate.

FIGS. 3a-3i illustrate, in relation to FIGS. 1 and 2a-2c, a process of forming an IPD structure over an EMC substrate. In FIG. 3a, a chase mold 120 has upper plate 120a and lower plate 120b. A releasable adhesive tape 122 is applied to upper plate 120a of chase mold 120. An optional metal carrier 124 is mounted to lower plate 120b. Carrier 124 can also be silicon, polymer, polymer composite, ceramic, glass, glass epoxy, beryllium oxide, tape, or other suitable low-cost, rigid material for structural support. Carrier 124 can be reusable in the manufacturing process. A releasable adhesive tape 126 is applied to carrier 124. Tape 122 and 126 are releasable by mechanical or thermal pressure. A laminated film 128 is formed over releasable tape 126. The film 128 can be metal, such as Cu and Al, or other electric conductive material. An open area 130 is provided between upper plate 120a and lower plate 120b to dispense encapsulant material.

Figure 3B:
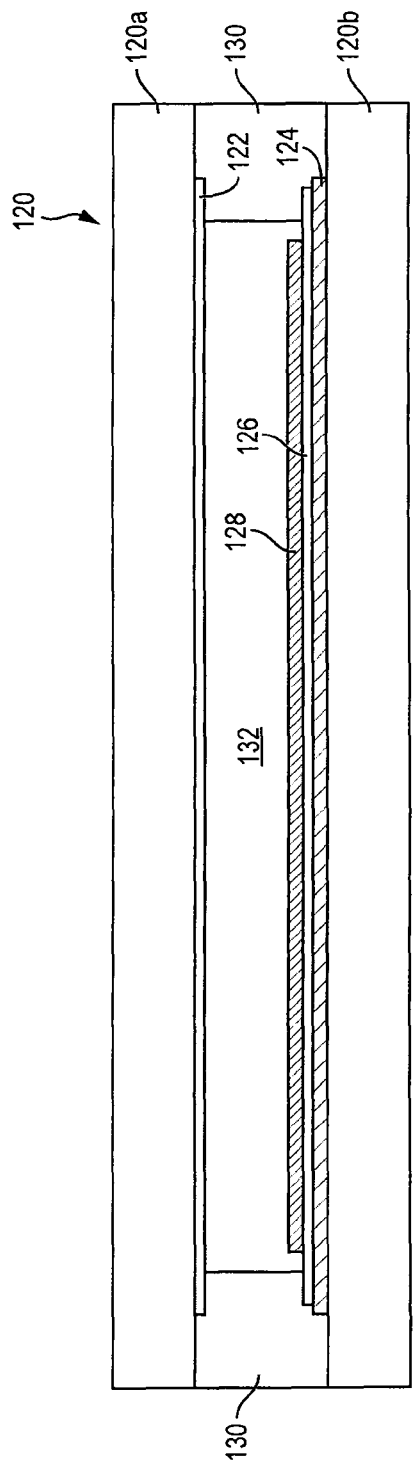
Figure 3C:
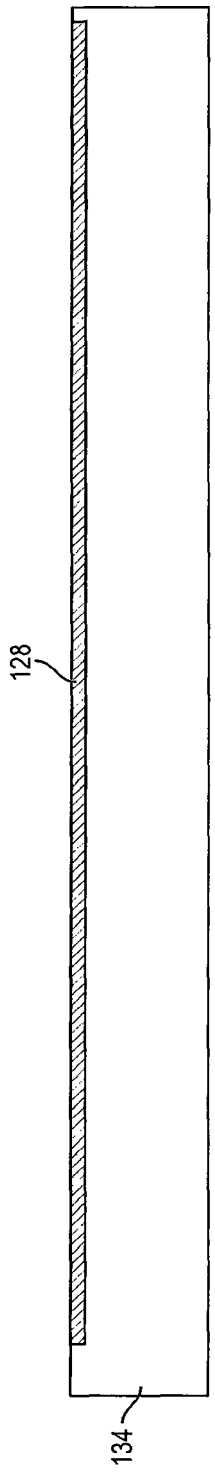

In FIG. 3b, an encapsulant material or molding compound 132 is dispensed into area 130, between over upper plate 120a and lower plate 120b, using compressive molding, transfer molding, liquid encapsulant molding, or other suitable applicator. Encapsulant 132 can be a liquid or granular form of polymer composite material, such as epoxy resin with filler, epoxy acrylate with filler, or polymer with proper filler. When cured and removed from mold chase 120, encapsulant 132 forms an EMC substrate or panel 134 with laminated film 128, as shown in FIG. 3c. EMC substrate 134 has high resistivity, low loss tangent, lower dielectric constant, coefficient of thermal expansion (CTE) matching the overlaying IPD structure, and good thermal conductivity.

Figure 3D:
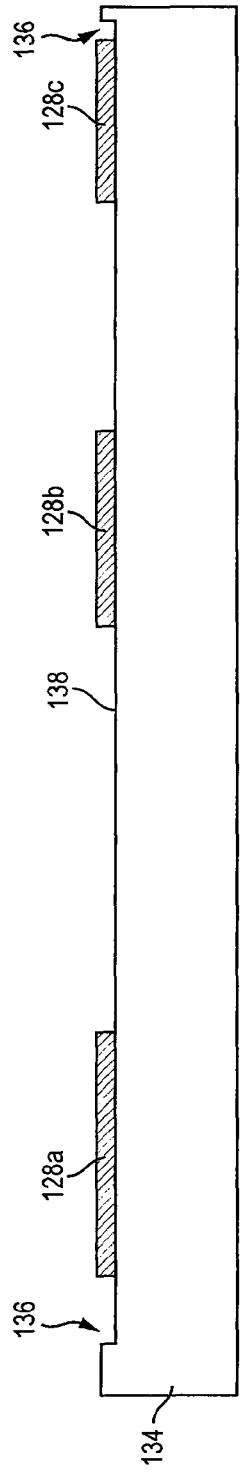

In FIG. 3d, film layer 128 is patterned and etched to provide a first conductive layer 128a-128c, as well as to form an indentation or shallow cavity 136 with surface 138 in EMC substrate 134. The individual portions of conductive layer 128a-128c can be electrically common or electrically isolated depending on the connectivity of the individual semiconductors die.

Figure 3E:
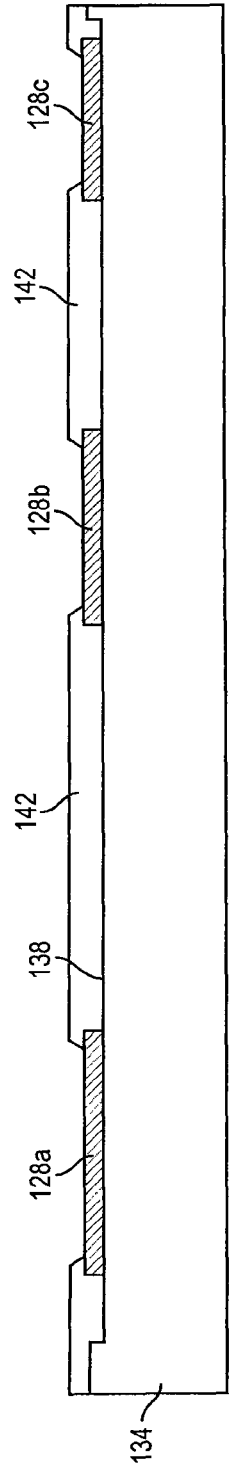

In FIG. 3e, an optional planarization insulating layer 142 can be formed over EMC substrate 134 and conductive layer 128 as one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. The insulating layer 142 serves to planarize the surface of EMC substrate 134 after removing laminated film 128 partially in order to improve step coverage of subsequent deposition and lithography processing steps.

Alternatively, insulating layer 142 can be used as dielectric for IPD's capacitor component, as described below. The remaining IPD structure described in FIG. 3f-3i is shown without optional planarization layer 142.

Figure 3F:
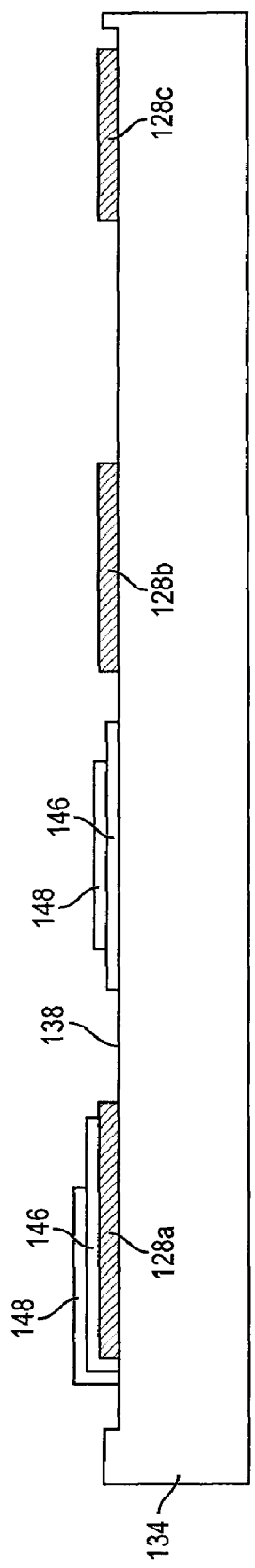

In FIG. 3f, a resistive layer 146 is formed over conductive layer 128a and surface 138 of substrate 134 using PVD, CVD, or other suitable deposition process. In one embodiment, resistive layer 146 can be tantalum silicide (TaxSiy) or other metal silicides, TaN, nickel chromium (NiCr), titanium (Ti), titanium nitride (TiN), titanium tungsten (TiW), or doped poly-silicon having a resistivity between 5 and 100 ohm/sq.

An insulating or dielectric layer 148 is formed over resistive layer 146 using patterning with PVD, CVD, printing, sintering, or thermal oxidation. The insulating layer 148 can be one or more layers of SiO2, Si3N4, SiON, Ta2O5, Al2O3, polyimide, BCB, PBO, or other suitable dielectric material.

Figure 3G:
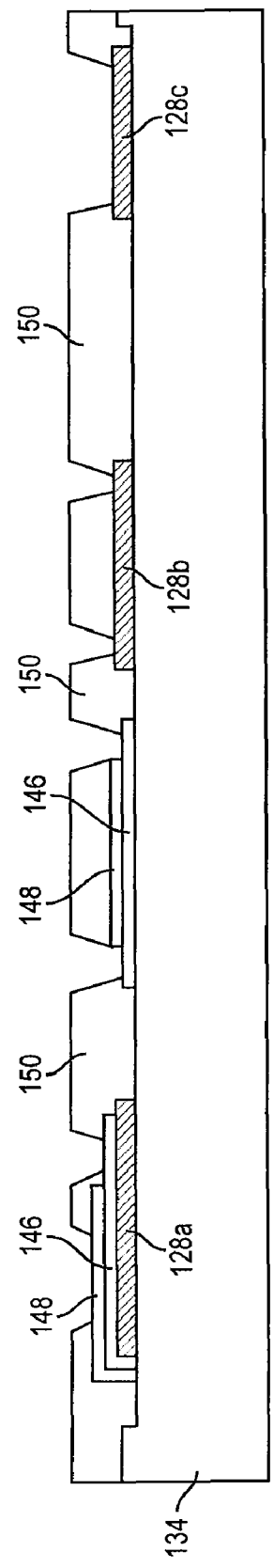

In FIG. 3g, an insulating or passivation layer 150 is formed over conductive layer 128, resistive layer 146, and insulating layer 148 using spin coating, PVD, CVD, printing, sintering, or thermal oxidation. The insulating layer 150 can be one or more layers of SiO2, Si3N4, SiON, Ta2O5, Al2O3, polyimide, BCB, PBO, or other material having suitable insulating properties. A portion of insulating layer 150 is removed to expose conductive layer 128, resistive layer 146, and insulating layer 148.

Figure 3H:
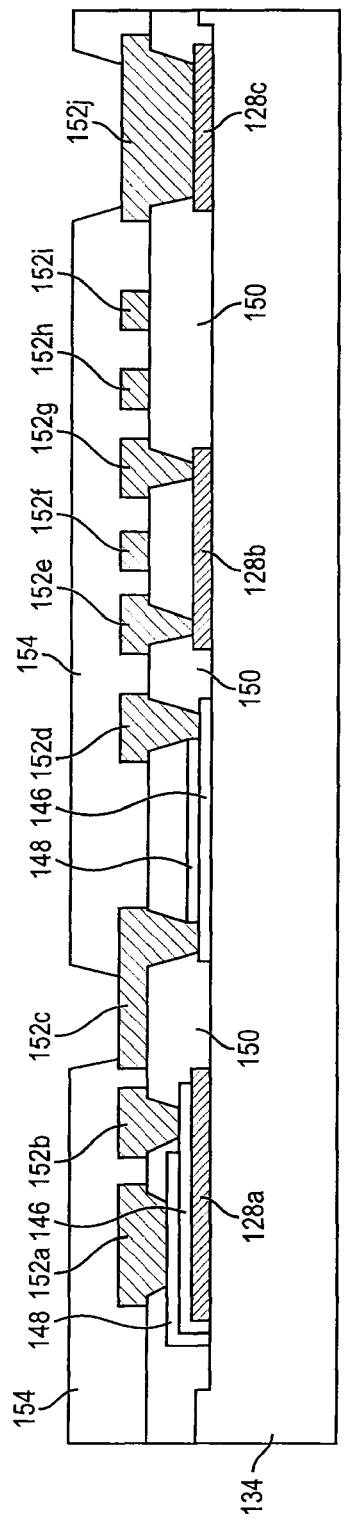

In FIG. 3h, an electrically conductive layer 152 is formed over conductive layer 128, insulating layers 148 and 150, and resistive layer 146 using patterning with PVD, CVD, sputtering, electrolytic plating, electroless plating process, or other suitable metal deposition process to form individual portions or sections 152a-152j. Conductive layer 152 can be one or more layers of Al, Cu, Sn, Ni, Au, Ag, or other suitable electrically conductive material. The individual portions of conductive layer 152a-152j can be electrically common or electrically isolated depending on the connectivity of the individual semiconductor die.

An insulating or passivation layer 154 is formed over insulating layer 150 and conductive layer 152 using spin coating, PVD, CVD, printing, sintering, or thermal oxidation. The insulating layer 154 can be one or more layers of SiO2, Si3N4, SiON, Ta2O5, Al2O3, polyimide, BCB, PBO, or other material having suitable insulating properties. A portion of insulating layer 154 is removed to expose conductive layer 152.

Figure 3I:
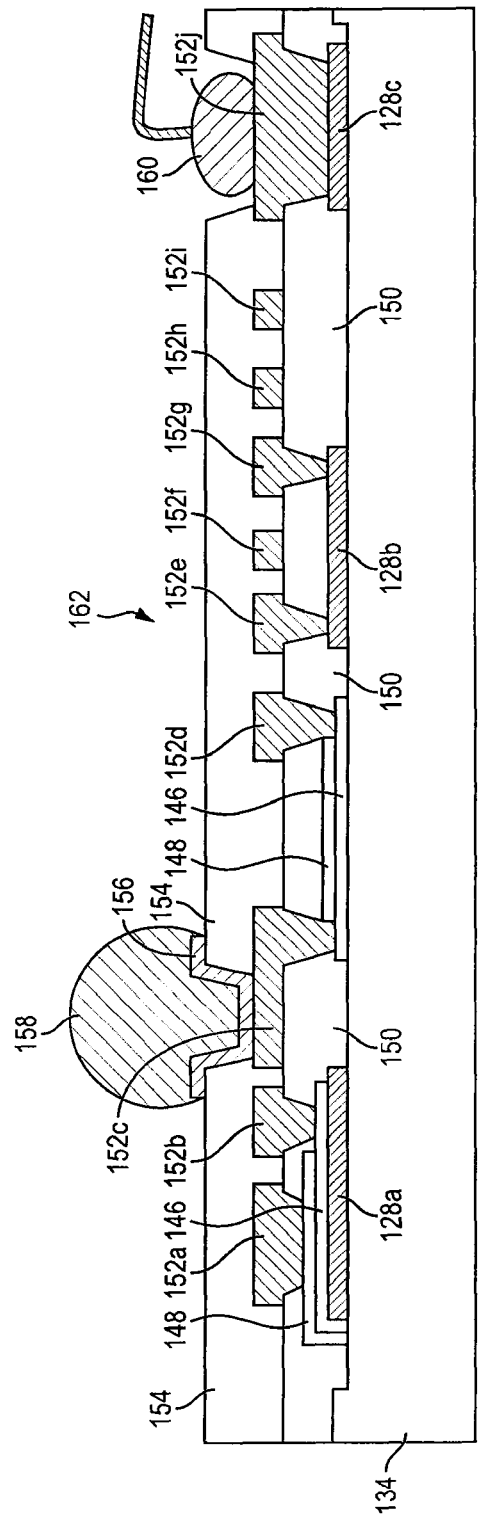

In FIG. 3i, an optional electrically conductive layer 156 is formed over conductive layer 152c using PVD, CVD, sputtering, electrolytic plating, electroless plating process, or other suitable metal deposition process. Conductive layer 156 can be one or more layers of Ti, TiW, NiV, Cr, CrCu, Al, Cu, Sn, Ni, Au, Ag, or other suitable electrically conductive material. In one embodiment, conductive layer 156 is an under bump metallization (UBM) containing a multi-layer metal stack with an adhesion layer, barrier layer, and seed or wetting layer. The adhesion layer is formed over conductive layer 152c and can be Ti, TiN, TiW, Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 152c and subsequent solder bumps or other interconnect structure. UBM 156 provides a low resistive interconnect to conductive layer 152c, as well as a barrier to solder diffusion and seed layer for solder wettability.

An electrically conductive bump material is deposited over UBM 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 156 using a suitable attachment or bonding process. In one embodiment, the bump material is reflowed by heating the material above its melting point to form spherical balls or bumps 158. In some applications, bumps 158 are reflowed a second time to improve electrical contact to UBM 156. The bumps can also be compression bonded to UBM 156. Bumps 158 represent one type of interconnect structure that can be formed over UBM 156. The interconnect structure can also use bond wires, conductive paste, stud bump, micro bump, or other electrical interconnect. For example, bond wire 160 is formed over conductive layer 152j.

The structures described in FIGS. 3c-3i constitute a plurality of passive circuit elements or IPDs 162. In one embodiment, conductive layer 128a, resistive layer 146, insulating layer 148, and conductive layer 152a is a metal insulator metal (MIM) capacitor. Resistive layer 146 between conductive layer 152c and 152d is a resistor element in the passive circuit. The individual sections of conductive layer 152d-152i can be wound or coiled in plan-view to produce or exhibit the desired properties of an inductor.

The IPD structure 162 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. Conductive layer 152j can be a ground plane for the IPD structure.

The IPD structure 162 formed over EMC substrate 134 simplifies the manufacturing process and reduces cost. EMC substrate 134 provides high resistivity, low loss tangent, low dielectric constant, matching CTE with the IPD structure, and good thermal conductivity.

Figure 4A:
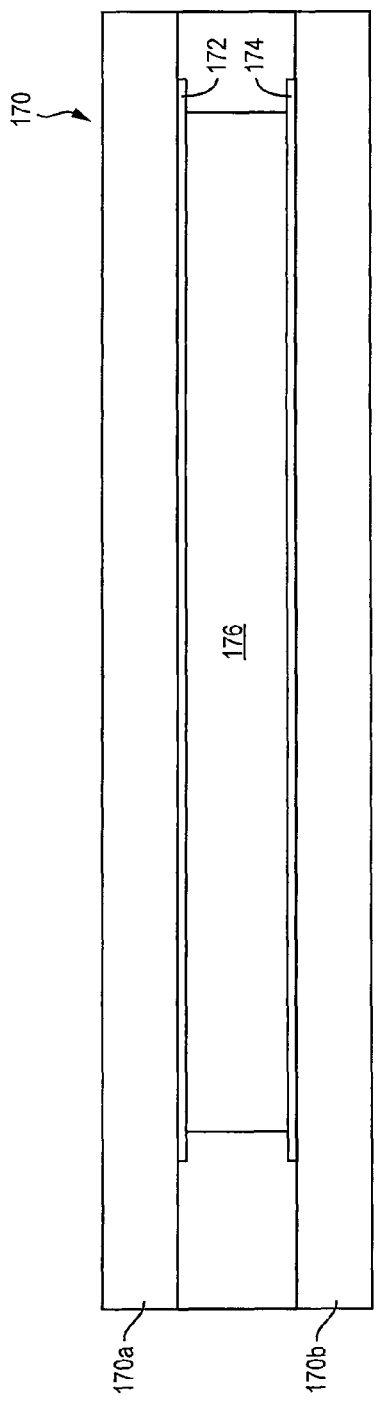
FIGS. 4a-4e illustrate another process of forming an IPD over a planar surface of an EMC substrate.
Figure 4B:
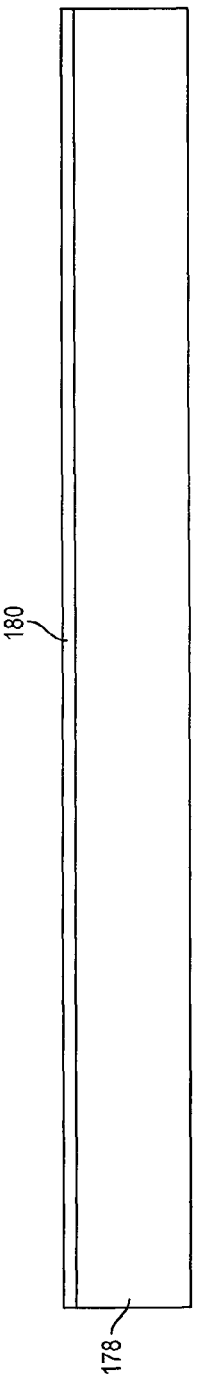

FIGS. 4a-4e illustrate, in relation to FIGS. 1 and 2a-2c, another process of forming an IPD structure over an EMC substrate. In FIG. 4a, a chase mold 170 has upper plate 170a and lower plate 170b. A releasable adhesive tape 172 is applied to upper plate 170a of chase mold 170. A releasable adhesive tape 174 is applied to lower plate 170b. Tape 172 and 174 are releasable by mechanical or thermal pressure. An encapsulant or molding compound 176 is dispensed into the open area between upper plate 170a and lower plate 170b using compressive molding, transfer molding, liquid encapsulant molding, or other suitable applicator. Encapsulant 176 can be a liquid or granular form of polymer composite material, such as epoxy resin with filler, epoxy acrylate with filler, or polymer with proper filler. When cured and removed from mold chase 170, encapsulant 176 forms an EMC substrate or panel 178, as shown in FIG. 4b. EMC substrate 178 has high resistivity, low loss tangent, lower dielectric constant, CTE matching the overlaying IPD structure, and good thermal conductivity. An optional interface layer 180 can be formed over EMC substrate 178 as a temporary bonding film or etch-stop layer.

Figure 4C:
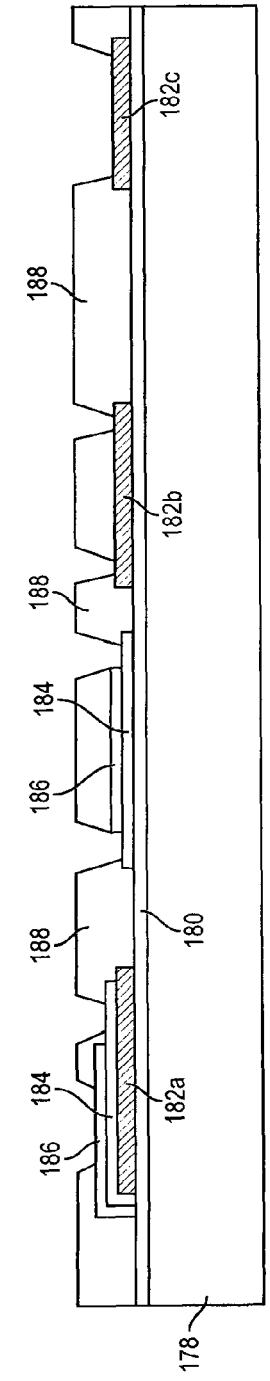

In FIG. 4c, an electrically conductive layer 182 is formed over interface and insulation layer 180 on substrate 178 using patterning with PVD, CVD, sputtering, electrolytic plating, electroless plating process, or other suitable metal deposition process to form individual portions or sections 182a-182c. Conductive layer 182 can be one or more layers of Al, Cu, Sn, Ni, Au, Ag, or other suitable electrically conductive material. The individual portions of conductive layer 182 can be electrically common or electrically isolated depending on the connectivity of the individual semiconductor die.

A resistive layer 184 is formed over conductive layer 182a and interface layer 180 of substrate 178 using PVD, CVD, or other suitable deposition process. In one embodiment, resistive layer 184 can be TaxSiy or other metal silicides, TaN, NiCr, Ti, TiN, TiW, or doped poly-silicon having a resistivity between 5 and 100 ohm/sq.

An insulating or dielectric layer 186 is formed over resistive layer 184 using patterning with PVD, CVD, printing, sintering, or thermal oxidation. The insulating layer 186 can be one or more layers of SiO2, Si3N4, SiON, Ta2O5, Al2O3, polyimide, BCB, PBO, or other suitable dielectric material.

An insulating or passivation layer 188 is formed over conductive layer 182, resistive layer 184, and insulating layer 186 using spin coating, PVD, CVD, printing, sintering, or thermal oxidation. The insulating layer 188 can be one or more layers of SiO2, Si3N4, SiON, Ta2O5, Al2O3, polyimide, BCB, PBO, or other material having suitable insulating properties. A portion of insulating layer 188 is removed to expose conductive layer 182, resistive layer 184, and insulating layer 186.

Figure 4D:
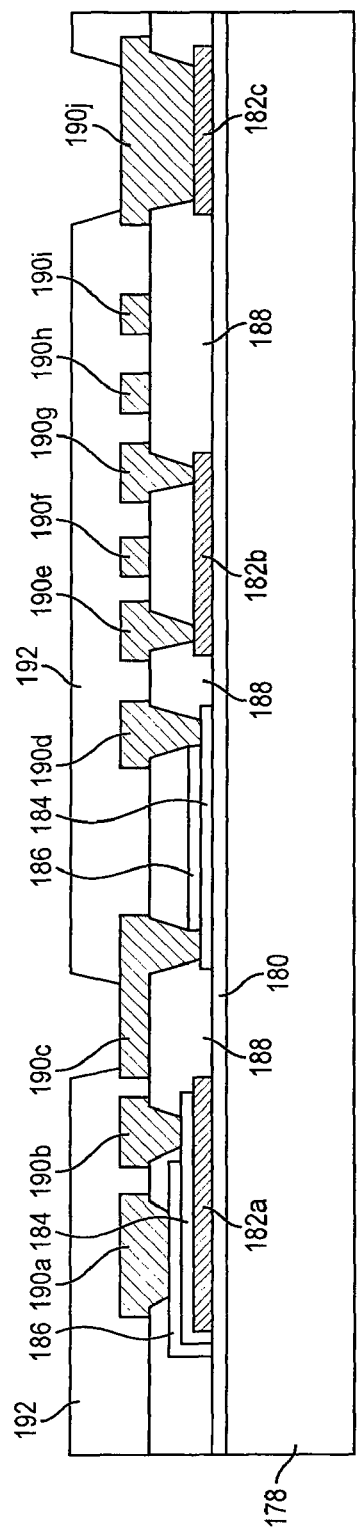

In FIG. 4d, an electrically conductive layer 190 is formed over conductive layer 182, insulating layers 186 and 188, and resistive layer 184 using patterning with PVD, CVD, sputtering, electrolytic plating, electroless plating process, or other suitable metal deposition process to form individual portions or sections 190a-190j. Conductive layer 190 can be one or more layers of Al, Cu, Sn, Ni, Au, Ag, or other suitable electrically conductive material. The individual portions of conductive layer 190a-190j can be electrically common or electrically isolated depending on the connectivity of the individual semiconductor die.

An insulating or passivation layer 192 is formed over insulating layer 188 and conductive layer 190 using spin coating, PVD, CVD, printing, sintering, or thermal oxidation. The insulating layer 192 can be one or more layers of SiO2, Si3N4, SiON, Ta2O5, Al2O3, polyimide, BCB, PBO, or other material having suitable insulating properties. A portion of insulating layer 192 is removed to expose conductive layer 190.

Figure 4E:
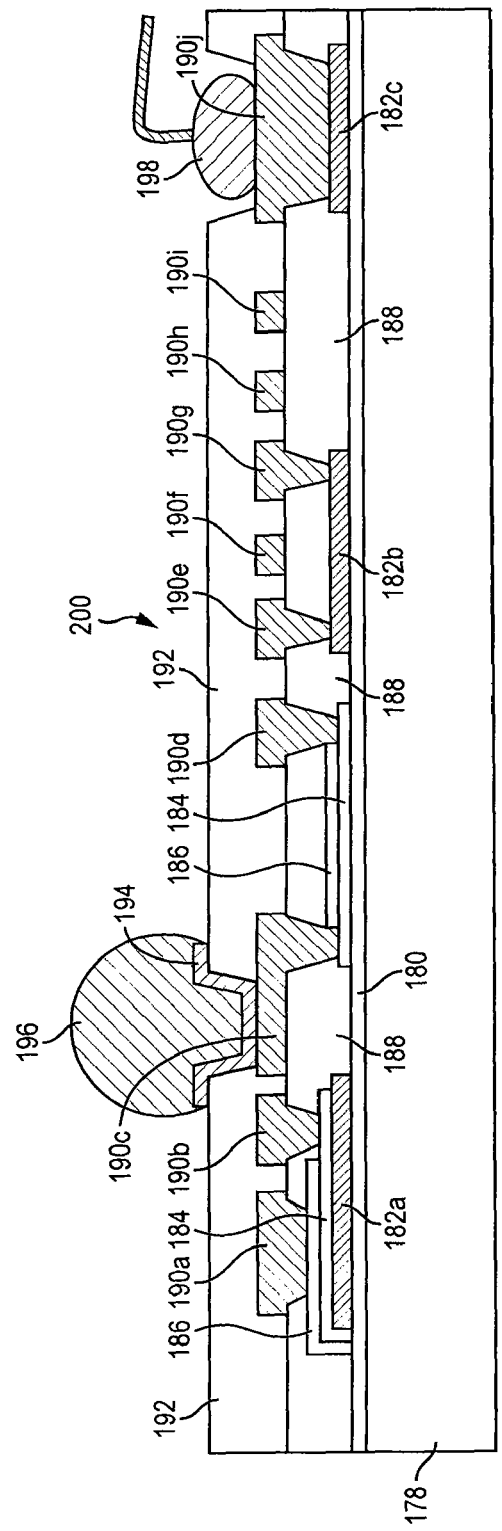

In FIG. 4e, an electrically conductive layer 194 is formed over conductive layer 190c using PVD, CVD, sputtering, electrolytic plating, electroless plating process, or other suitable metal deposition process. Conductive layer 194 can be one or more layers of Ti, TiW, NiV, Cr, CrCu, Al, Cu, Sn, Ni, Au, Ag, or other suitable electrically conductive material. In one embodiment, conductive layer 194 is a UBM containing a multi-layer metal stack with an adhesion layer, barrier layer, and seed or wetting layer. The adhesion layer is formed over conductive layer 190c and can be Ti, TiN, TiW, Al, or Cr. The barrier layer is formed over the adhesion layer and can be made of Ni, NiV, Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 190c and subsequent solder bumps or other interconnect structure. UBM 194 provides a low resistive interconnect to conductive layer 190c, as well as a barrier to solder diffusion and seed layer for solder wettability.

An electrically conductive bump material is deposited over UBM 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 194 using a suitable attachment or bonding process. In one embodiment, the bump material is ref lowed by heating the material above its melting point to form spherical balls or bumps 196. In some applications, bumps 196 are ref lowed a second time to improve electrical contact to UBM 194. The bumps can also be compression bonded to UBM 194. Bumps 196 represent one type of interconnect structure that can be formed over UBM 194. The interconnect structure can also use bond wires, conductive paste, stud bump, micro bump, or other electrical interconnect. For example, bond wire 198 is formed over conductive layer 190j.

The structures described in FIGS. 4b-4e constitute a plurality of passive circuit elements or IPDs 200. In one embodiment, conductive layer 182a, resistive layer 184, insulating layer 186, and conductive layer 190a is a MIM capacitor. Resistive layer 184 between conductive layer 190c and 190d is a resistor element in the passive circuit. The individual sections of conductive layer 190d-190i can be wound or coiled in plan-view to produce or exhibit the desired properties of an inductor.

The IPD structure 200 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions. Conductive layer 190j can be a ground plane for the IPD structure.

The IPD structure 200 formed over EMC substrate 178 simplifies the manufacturing process and reduces cost. EMC substrate 178 provides high resistivity, low loss tangent, low dielectric constant, matching CTE with the IPD structure, and good thermal conductivity.

Figure 5:
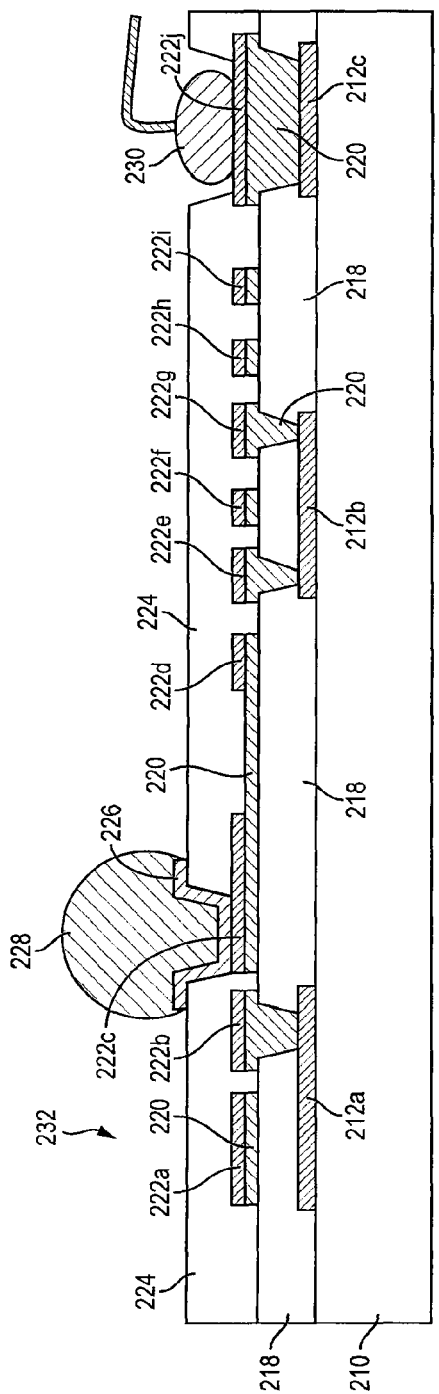
FIG. 5 illustrates another EMC substrate with an IPD formed over a planar surface.

FIG. 5 illustrates another IPD structure formed over an EMC substrate. Using a chase mold, an EMC substrate or panel 210 is formed in a similar manner as FIG. 4a. EMC substrate 210 has high resistivity, low loss tangent, lower dielectric constant, CTE matching the overlaying IPD structure, and good thermal conductivity.

An electrically conductive layer 212 is formed over substrate 210 using patterning with PVD, CVD, sputtering, electrolytic plating, electroless plating process, or other suitable metal deposition process to form individual portions or sections 212a-212c. Conductive layer 212 can be one or more layers of Al, Cu, Sn, Ni, Au, Ag, or other suitable electrically conductive material. The individual portions of conductive layer 212 can be electrically common or electrically isolated depending on the connectivity of the individual semiconductor die.

An insulating or passivation layer 218 is formed over conductive layer 212 using spin coating, PVD, CVD, printing, sintering, or thermal oxidation. The insulating layer 218 can be one or more layers of SiO2, Si3N4, SiON, Ta2O5, Al2O3, or other material having suitable insulating properties. A portion of insulating layer 218 is removed to expose conductive layer 212.

An electrically conductive layer 220 is formed over insulating layer 218 using patterning with PVD, CVD, sputtering, electrolytic plating, electroless plating process, or other suitable metal deposition process. Conductive layer 220 is an adhesion layer or barrier layer. Conductive layer 220 operates as a resistive layer for the IPD structure.

An electrically conductive layer 222 is formed over conductive layer 220 using patterning with PVD, CVD, sputtering, electrolytic plating, electroless plating process, or other suitable metal deposition process to form individual portions or sections 222a-222j. Conductive layer 222 can be one or more layers of Al, Cu, Sn, Ni, Au, Ag, or other suitable electrically conductive material. The individual portions of conductive layer 222a-222j are electrically common or electrically isolated depending on the connectivity of the individual semiconductor die.

An insulating or passivation layer 224 is formed over insulating layer 218 and conductive layers 220 and 222 using spin coating, PVD, CVD, printing, sintering, or thermal oxidation. The insulating layer 224 can be one or more layers of SiO2, Si3N4, SiON, Ta2O5, Al2O3, polyimide, BCB, PBO, or other material having suitable insulating properties. A portion of insulating layer 224 is removed to expose conductive layer 222.

An electrically conductive layer 226 is formed over conductive layer 222c using PVD, CVD, sputtering, electrolytic plating, electroless plating process, or other suitable metal deposition process. Conductive layer 226 can be one or more layers of Al, Cu, Sn, Ni, Au, Ag, or other suitable electrically conductive material. In one embodiment, conductive layer 226 is a UBM containing a multi-layer metal stack with an adhesion layer, barrier layer, and seed or wetting layer. The adhesion layer is formed over conductive layer 222c and can be Ti, TiN, TiW, Al, or Cr. The barrier layer is formed over the adhesion layer and can be made of Ni, NiV, Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 222c and subsequent solder bumps or other interconnect structure. UBM 226 provides a low resistive interconnect to conductive layer 222c, as well as a barrier to solder diffusion and seed layer for solder wettability.

An electrically conductive bump material is deposited over UBM 226 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 226 using a suitable attachment or bonding process. In one embodiment, the bump material is reflowed by heating the material above its melting point to form spherical balls or bumps 228. In some applications, bumps 228 are reflowed a second time to improve electrical contact to UBM 226. The bumps can also be compression bonded to conductive layer 226. Bumps 228 represent one type of interconnect structure that can be formed over UBM 226. The interconnect structure can also use bond wires, conductive paste, stud bump, micro bump, or other electrical interconnect. For example, bond wire 230 is formed over conductive layer 222j.

The structures described in FIG. 5 constitute a plurality of passive circuit elements or IPDs 232. In one embodiment, conductive layer 212a, insulating layer 218, conductive layer 220, and conductive layer 222a is a MIM capacitor. The individual sections of conductive layer 222d-222i can be wound or coiled in plan-view to produce or exhibit the desired properties of an inductor.

The IPD structure 232 provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions. Conductive layer 190j can be a ground plane for the IPD structure.

The IPD structure 232 formed over EMC substrate 210 simplifies the manufacturing process and reduces cost. EMC substrate 210 provides high resistivity, low loss tangent, low dielectric constant, matching CTE with the IPD structure, and good thermal conductivity.

Figure 6:
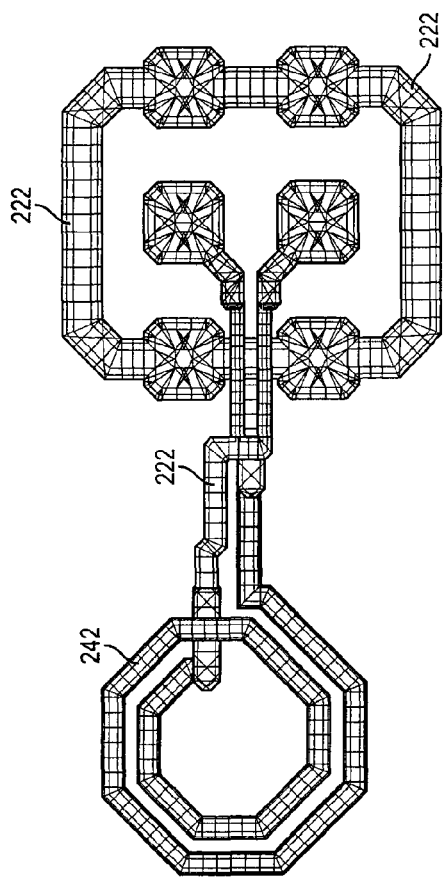
FIG. 6 illustrates a conductor wound to form an inductor.

FIG. 6 shows an exemplary inductor 242 formed with conductive layer 222.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   forming a molded substrate;
   forming a first conductive layer over the molded substrate;
   removing a portion of the first conductive layer;
   forming a resistive layer over the first conductive layer;
   forming a first insulating layer over the resistive layer;
   forming a second insulating layer over the first insulating layer, resistive layer, first conductive layer, and molded substrate;
   removing a portion of the second insulating layer to expose the first insulating layer, resistive layer, and first conductive layer;
   forming a second conductive layer over the first insulating layer, resistive layer, and first conductive layer;
   forming a third insulating layer over the second insulating layer and second conductive layer;
   removing a portion of the third insulating layer to expose the second conductive layer; and
   forming a bump over the second conductive layer.

2. The method of claim 1, further including depositing an encapsulant material between first and second plates of a chase mold to form the molded substrate.

3. The method of claim 2, further including:
   applying a first releasable layer over the first plate; and
   applying a second releasable layer over the second plate.

4. The method of claim 3, further including forming a conductive film layer over the first releasable layer to create the first conductive layer and a cavity in the molded substrate.

5. The method of claim 1, further including forming a third conductive layer between the second conductive layer and bump.

6. The method of claim 1, wherein the first conductive layer, resistive layer, first insulating layer, and second conductive layer constitute a metal-insulator-metal capacitor.

7. The method of claim 1, wherein the second conductive layer is wound to exhibit inductive properties.

8. A method of making a semiconductor device, comprising:
   forming a molded substrate;
   forming a first conductive layer over the molded substrate;
   forming a first insulating layer over the first conductive layer;
   forming a second insulating layer over the first insulating layer, first conductive layer, and molded substrate;
   forming a second conductive layer over the first insulating layer and first conductive layer;
   forming a third insulating layer over the second insulating layer and second conductive layer; and
   forming an interconnect over the second conductive layer.

9. The method of claim 8, further including depositing an encapsulant material between first and second plates of a chase mold to form the molded substrate.

10. The method of claim 9, further including:
    applying a first releasable layer over the first plate; and
    applying a second releasable layer over the second plate.

11. The method of claim 10, further including forming a film layer over the first releasable layer to create a cavity in the molded substrate.

12. The method of claim 8, wherein the interconnect includes a bump or bond wire.

13. The method of claim 8, wherein the first conductive layer, first insulating layer, and second conductive layer constitute a metal-insulator-metal capacitor, and the second conductive layer is wound to exhibit inductive properties.

14. A method of making a semiconductor device, comprising:
    forming a molded substrate, wherein forming the molded substrate includes depositing an encapsulant material between a first plate of a chase mold and a second plate of the chase mold;
    forming an integrated passive device (IPD) over the molded substrate; and
    forming an interconnect over the IPD.

15. The method of claim 14, wherein forming the IPD includes:
    forming a first conductive layer over the molded substrate;
    forming a resistive layer over the first conductive layer;
    forming a first insulating layer over the resistive layer;
    forming a second insulating layer over the first insulating layer, resistive layer, first conductive layer, and molded substrate;
    forming a second conductive layer over the second insulating layer, resistive layer, and first conductive layer; and
    forming a third insulating layer over the second insulating layer and second conductive layer.

16. The method of claim 15, wherein the first conductive layer, resistive layer, first insulating layer, and second conductive layer constitute a metal-insulator-metal capacitor, and the second conductive layer is wound to exhibit inductive properties.

17. A method of making a semiconductor device, comprising:
    forming a molded substrate;
    forming an integrated passive device (IPD) over the molded substrate;
    forming an interconnect over the IPD;
    depositing an encapsulant material between first and second plates of a chase mold to form the molded substrate;
    applying a first releasable layer over the first plate; and
    applying a second releasable layer over the second plate.

18. The method of claim 17 further including forming a film layer over the first releasable layer to create a cavity in the molded substrate.

19. A semiconductor device, comprising:
    a molded substrate;
    a first conductive layer formed over the molded substrate;
    a first insulating layer formed over the first conductive layer;
    a second insulating layer formed over the first insulating layer, first conductive layer, and molded substrate;
    a second conductive layer formed over the second insulating layer and first conductive layer;
    a third insulating layer formed over the second insulating layer and second conductive layer; and
    an interconnect formed over the second conductive layer.

20. The semiconductor device of claim 19, wherein the molded substrate includes a cavity formed in a surface of the molded substrate.

21. The semiconductor device of claim 19, wherein the interconnect includes a bump or bond wire.

22. The semiconductor device of claim 19, wherein the first conductive layer, first insulating layer, and second conductive layer constitute a metal-insulator-metal capacitor.

23. The semiconductor device of claim 19, wherein a portion of the second conductive layer includes an inductor.

24. The semiconductor device of claim 19, wherein a portion of the second conductive layer includes an integrated passive device.

25. A method of making a semiconductor device, comprising:
    applying a first releasable layer over a first plate of a chase mold;
    applying a second releasable layer over a second plate of the chase mold;
    depositing an encapsulant material between the first plate of the chase mold and the second plate of the chase mold to form a molded substrate;
    forming an integrated passive device (IPD) over the molded substrate; and
    forming an interconnect over the IPD.

26. The method of claim 25, further comprising forming a film layer over the first releasable layer.

27. The method of claim 25, wherein forming the IPD over the molded substrate comprises:
    forming a first conductive layer over the molded substrate;
    forming a resistive layer over the first conductive layer;
    forming a first insulating layer over the resistive layer;
    forming a second insulating layer over the first insulating layer, resistive layer, first conductive layer, and molded substrate;
    forming a second conductive layer over the second insulating layer, resistive layer, and first conductive layer; and
    forming a third insulating layer over the second insulating layer and second conductive layer.

28. The method of claim 27, wherein the first conductive layer, resistive layer, first insulating layer, and second conductive layer constitute a metal-insulator-metal capacitor, and the second conductive layer is wound to exhibit inductive properties.

* * * * *